United States Patent
Kim

(10) Patent No.: US 9,305,980 B2
(45) Date of Patent: Apr. 5, 2016

(54) FLEXIBLE DISPLAY DEVICE AND METHOD OF FABRICATING THE SAME

(71) Applicant: SAMSUNG DISPLAY CO., LTD., Yongin, Gyeonggi-Do (KR)

(72) Inventor: Jae-Hun Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 226 days.

(21) Appl. No.: 14/023,502

(22) Filed: Sep. 11, 2013

(65) Prior Publication Data

US 2014/0231763 A1 Aug. 21, 2014

(30) Foreign Application Priority Data

Feb. 21, 2013 (KR) ........................ 10-2013-0018837

(51) Int. Cl.
*H01L 51/52* (2006.01)
*H01L 27/32* (2006.01)

(52) U.S. Cl.
CPC ..... *H01L 27/3218* (2013.01); *H01L 2251/5338* (2013.01)

(58) Field of Classification Search
CPC ............ H01L 51/0097; H01L 27/3244; H01L 51/5256; H01L 51/56; H01L 27/3276; H01L 2227/323

See application file for complete search history.

(56) References Cited

U.S. PATENT DOCUMENTS

| | | | |
|---|---|---|---|
| 2006/0007369 A1 | 1/2006 | Jin et al. | |
| 2008/0265244 A1* | 10/2008 | Sirringhaus et al. | 257/40 |
| 2012/0002357 A1* | 1/2012 | Auld et al. | 361/679.01 |

FOREIGN PATENT DOCUMENTS

| | | |
|---|---|---|
| KR | 10-2006-0001661 A | 1/2006 |
| KR | 10-2010-0086884 A | 8/2010 |

* cited by examiner

*Primary Examiner* — Donald Raleigh
(74) *Attorney, Agent, or Firm* — Lee & Morse, P.C.

(57) ABSTRACT

A flexible display device includes a substrate including a bending area that is bent and a flat area that is not bent; a device/wiring layer including a thin film transistor, the device/wiring layer being on the substrate; first pixel units on the flat area on the device/wiring layer; and second pixel units on the bending area on the device/wiring layer, an inter-pixel interval of the first pixel units being different from an inter-pixel interval of the second pixel units.

20 Claims, 4 Drawing Sheets

FLEXIBLE DISPLAY DEVICE AND METHOD OF FABRICATING THE SAME

CROSS-REFERENCE TO RELATED APPLICATION

This application claims the benefit of and priority under 35 U.S.C. §119 to Korean Patent Application No. 10-2013-0018837, filed on Feb. 21, 2013, in the Korean Intellectual Property Office, and entitled: "FLEXIBLE DISPLAY DEVICE AND METHOD OF FABRICATING THE SAME," which is incorporated by reference herein in its entirety.

BACKGROUND

1. Field

Embodiments relate to a flexible display device and a method of fabricating the same.

2. Description of the Related Art

A display device refers to a device that displays an image signal. Display devices include all devices that display an externally input image signal, such as a television, a computer monitor, a personal digital assistant (PDA), and a smart device, demand for which has explosively increased.

These display devices use a high-quality flat display module such as an organic light emitting display panel, a liquid crystal display (LCD) panel, a plasma display panel, an electrophoretic display panel, etc.

Recently, a flexible display device that is light, thin, and portable is being developed. The flexible display device refers to a display capable of maintaining a curved shape or being transformed into a curved shape by using a flexible substrate.

SUMMARY

Embodiments are directed to a flexible display device, including a substrate including a bending area that is bent and a flat area that is not bent; a device/wiring layer including a thin film transistor, the device/wiring layer being on the substrate; first pixel units on the flat area on the device/wiring layer; and second pixel units on the bending area on the device/wiring layer, an inter-pixel interval of the first pixel units being different from an inter-pixel interval of the second pixel units.

The inter-pixel interval of the second pixel units may be smaller than the inter-pixel unit of the first pixel unit.

The inter-pixel interval of the second pixel units may be set such that a number of pixels per unit area of the second pixel units has the same number of pixels per unit of the first pixel units of the flat area when the bending area is bent.

Compressive and tensile stress may be not generated in the flat area if the flexible display device is bent, and tensile stress may be generated on an upper surface of the bending area and compressive stress may be generated on a lower surface of the bending area when the flexible display device is bent in the bending area.

The substrate may include polyethyleneterephthalate, polyethylenenaphthalate, polycarbonate, polyarylate, polyetherimide, polyethersulfone, or polyimide.

The bending area may be fixed in a bent state.

The first pixel units and the second pixel units may include an organic light emitting layer.

The flexible display device may further include a sealing layer covering the first pixel units and the second pixel unit.

The sealing layer may include alternating organic and inorganic films or a multi-layer inorganic film.

Embodiments are also directed to a flexible display device, including a substrate including a flat area that is not bent and a bending area that is fixed in a bent form; first pixel units on the flat area; and second pixel units on the bending area, a number of pixels per unit area of the first pixel units being the same as a number of pixels per unit area of the second pixel units.

The bending area may be bent from greater than 0 degrees to about 180 degrees, and is fixed.

The substrate may include polyethyleneterephthalate, polyethylenenaphthalate, polycarbonate, polyarylate, polyetherimide, polyethersulfone, or polyimide.

The first pixel units and the second pixel units may include an organic light emitting layer.

The flexible display device may further include a sealing layer covering the first pixel units and the second pixel units.

The sealing layer may include alternating organic and inorganic films or a multi-layer inorganic film.

Embodiments are also directed to a method of manufacturing a flexible display device, the method including preparing a substrate including a flat area that is not bent and a bending area that is fixed in a bent form, the substrate having a radius of curvature of the bending area in the bent form; and forming first pixel units on the flat area and second pixel units on the bending area so that a number of pixels per unit area in a state where the bending area is bent is the same as a number of pixels per unit area in the flat area based on the radius of curvature.

An inter-pixel interval of the second pixel units may be smaller than an inter-pixel interval of the first pixel units.

The first pixel units and the second pixel units may include an organic light emitting layer.

The method may further include forming a sealing layer to cover the first pixel units and the second pixel unit.

The sealing layer may be formed by alternating an organic film and an inorganic film or is formed as a multi-layer inorganic film.

BRIEF DESCRIPTION OF THE DRAWINGS

Features will become apparent to those of skill in the art by describing in detail example embodiments with reference to the attached drawings in which.

DETAILED DESCRIPTION

Figure 1:
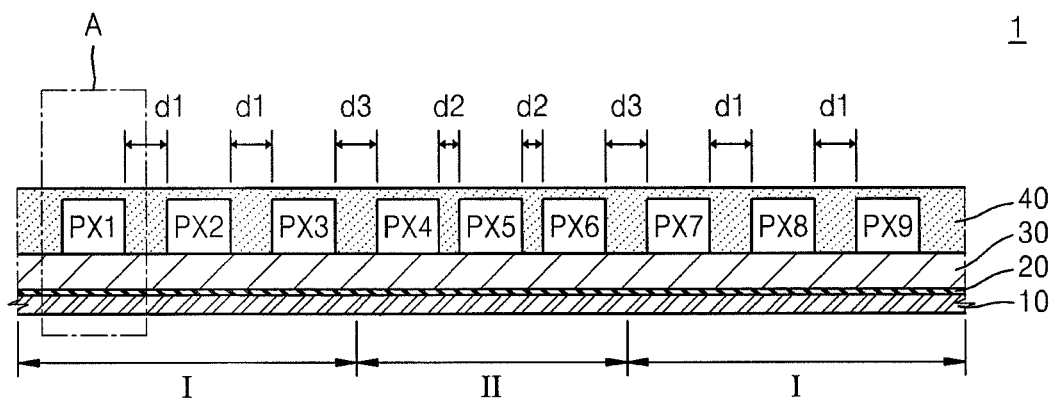
FIG. 1 is a cross-sectional view schematically illustrating a flexible display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. Like reference numerals in the drawings denote like elements.

As used herein, the term "and/or" includes any and all combinations of one or more of the associated listed items.

Figure 2:
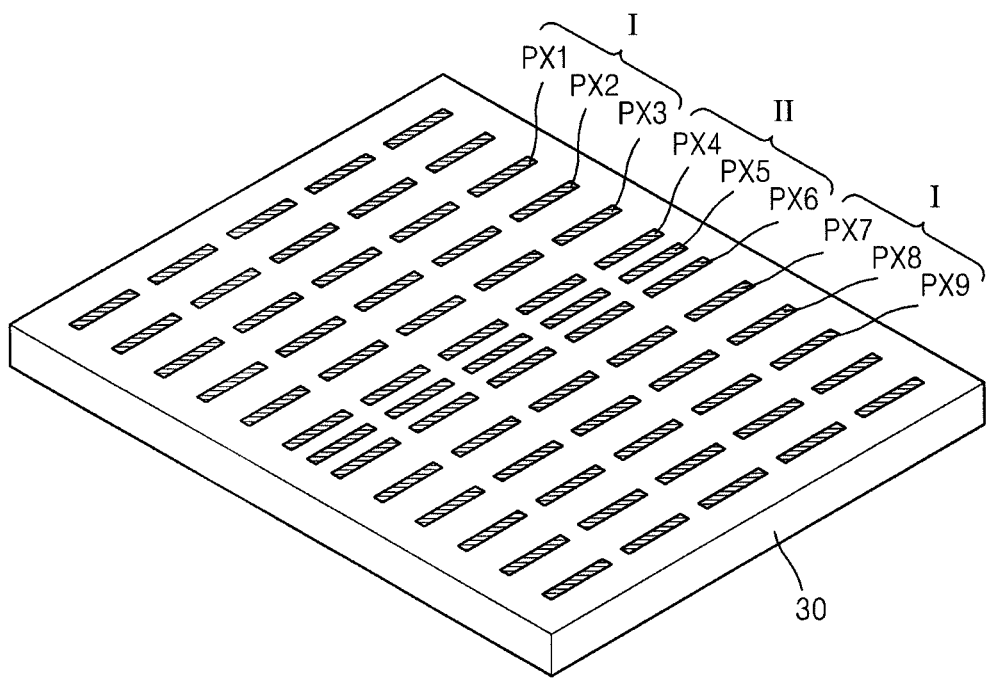
FIG. 2 is a perspective view schematically illustrating the flexible display device of FIG. 1.

FIG. 1 is a cross-sectional view schematically illustrating a flexible display device 1 according to an example embodiment, and FIG. 2 is a perspective view schematically illustrating the flexible display device 1 of FIG. 1.

The flexible display device 1 according to an example embodiment is fixed on a case so that a bent state of a bending area II may be maintained. According to an example embodiment, a stain problem may be prevented from arising when pixels are operated in both a flat area I and the bending area II.

Referring to FIGS. 1 and 2 together, the flexible display device 1 according to an example embodiment includes a substrate 10, a buffer layer 20 formed on the substrate 10, a device/wiring layer 30 including a plurality of thin film transistors (TFTs) (not shown) formed on the buffer layer 20, a plurality of pixel units (PX1, . . . , PX9) formed on the device/wiring layer 30, and a sealing layer 40 formed on the plurality of pixel units (PX1, . . . , PX9).

The substrate 10 includes the flat area I and the bending area II. The flat area I is an area that is not bent, and the bending area II is an area that is bent. Also, the bending area II is mounted on the case (not shown) in a bent state.

The substrate 10 may be formed of plastic such as polyethyleneterephthalate (PET), polyethylenenaphthalate (PEN), polycarbonate (PC), polyarylate (PAR), polyetherimide (PEI), polyethersulfone (PES), polyimide (PI), etc. However, the present example embodiment is not limited thereto, and the substrate 10 may be formed of various flexible materials.

The buffer layer 20 may be disposed on the substrate 10. The buffer layer 20 helps prevent outside materials such as moisture and oxygen from penetrating the substrate 10 and permeating the device/wiring layer 30 and/or the pixel units (PX1, . . . , PX9), etc.

The device/wiring layer 30 may be disposed on the buffer layer 20, and the device/wiring layer 30 may include an operating TFT that operates the pixel units (PX1, . . . , PX9), a switching TFT (not shown), a capacitor, wiring sets (not shown) connected to the TFT or the capacitor, etc.

A plurality of pixel units (PX1, . . . , PX9) may be disposed on the device/wiring layer 30.

The plurality of pixel units (PX1, . . . , PX9) include first pixel units (PX1, PX2, PX3, PX7, PX8, PX9) formed on the flat area I and second pixel units (PX4, PX5, PX6) formed on the bending area II.

According to an example embodiment, inter-pixel intervals d1 between pixels of the first pixel units (PX1, PX2, PX3, PX7, PX8, PX9) formed on the flat area I are the same, and inter-pixel intervals d2 between pixels of the second pixel units (PX4, PX5, PX6) formed on the bending area II are narrower than the inter-pixel intervals d1 between pixels of the first pixel units (PX1, PX2, PX3, PX7, PX8, PX9). The number of pixels per unit area of the second pixel units (PX4, PX5, PX6) before being bent is greater than the number of pixels per unit area of the first pixel units (PX1, PX2, PX3, PX7, PX8, PX9).

If the flexible display device 1 is mounted on the case (not shown) in a bent state, tensile stress may be applied to the upper surface of the bending area II, and compressive stress may be applied to the lower surface of the bending area II.

Hence, the inter-pixel distance of the flat area I that is not bent has a constant value or the bending area II is bent so that the radius of curvature increases, and thus the inter-pixel interval becomes larger than the interval before being bent.

As such, when the pixels are formed at regular intervals in both the bending area II and the flat area I and the bending area II is bent, the flat area I and the bending area II have different numbers of pixels per unit area, thereby generating a stain phenomenon.

However, according to an example embodiment, the flat area I is distinguished from the bent area II, and the inter-pixel interval in the bending area II, compared with the inter-pixel interval of the flat area I, is to be formed narrower.

Hence, even if the bending area II of the flexible display device 1 is mounted on the case in a bent state, the flat area I and the bent area II may have the same number of pixels per unit area, and thus the stain phenomenon of the flexible display device 1 may be prevented.

Furthermore, inter-pixel distances d3 of the pixel units (PX3 & PX4, PX6 & PX7) formed around the boundary between the bending area II and the flat area I may be the same as or smaller than the inter-pixel distances d1 of the first pixel units (PX1, PX2, PX3, PX7, PX8, PX9).

The inter-pixel interval d2 in the bending area II may be determined in consideration of the thickness of the bending area II, the size of the radius of curvature, a degree of bending, etc. Furthermore, the inter-pixel distance d3 in the boundary between the flat area I and the bending area II may be determined in consideration of the thickness of the bending area II, the size of the radius of curvature, the degree of bending, etc.

Hence, the inter-pixel interval of the bending area II may be adjusted by calculating the radius of curvature of the upper surface of the bending area II after the bending regardless of the degree of bending of the bending area II, and thus the color distortion of the flexible display device 1 may be prevented regardless of the size of the radius of curvature.

A pixel unit having nine pixels has been described above, but the present example embodiment is not limited thereto. Also, the second pixel units (PX4, PX5, PX6) of the bending area II have been described to include three pixels, but the present example embodiment is not limited thereto, and the number of pixels may vary depending on the area of the bending area II, the degree of bending, etc.

Figure 3:
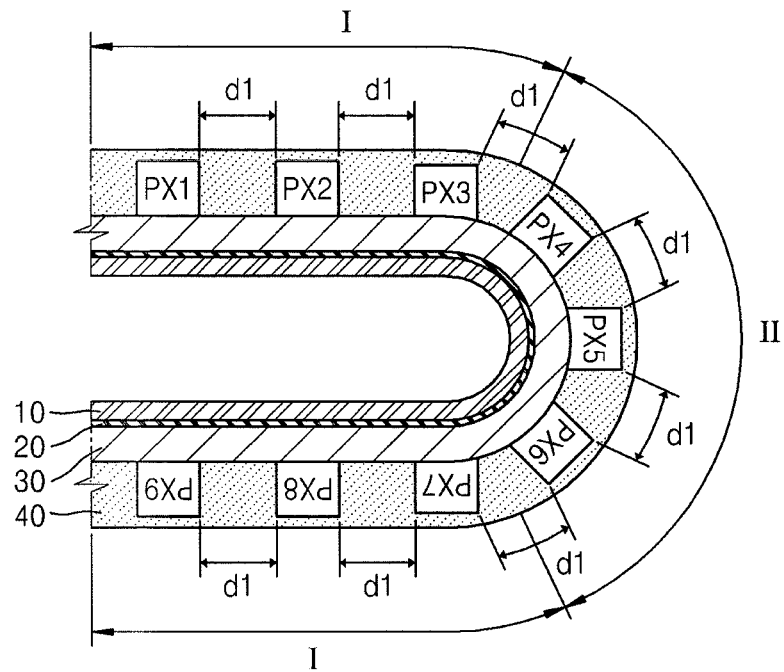
FIG. 3 is a cross-sectional view schematically illustrating a bent form of the flexible display device of FIG. 1.

FIG. 3 is a cross-sectional view schematically illustrating a bent form of the flexible display device 1 of FIG. 1. The bending area of the flexible display device 1 is fixed and is mounted on the case (not shown) as illustrated in FIG. 3.

Referring to FIG. 3, after the bending, the inter-pixel interval d1 in the bending area II is the same as the inter-pixel interval d1 in the flat area I.

In the example embodiment shown in FIG. 3, the flat area I and the bending area II have the same number of pixels per unit area, and thus a color difference between the areas I and II does not occur.

Hence, according to an example embodiment, the flat area I is separated from the bending area II so that the inter-pixel intervals in respective areas I and II may be differentiated, and thus the color difference between respective areas I and II may be prevented, thereby preventing a stain phenomenon.

Figure 4:
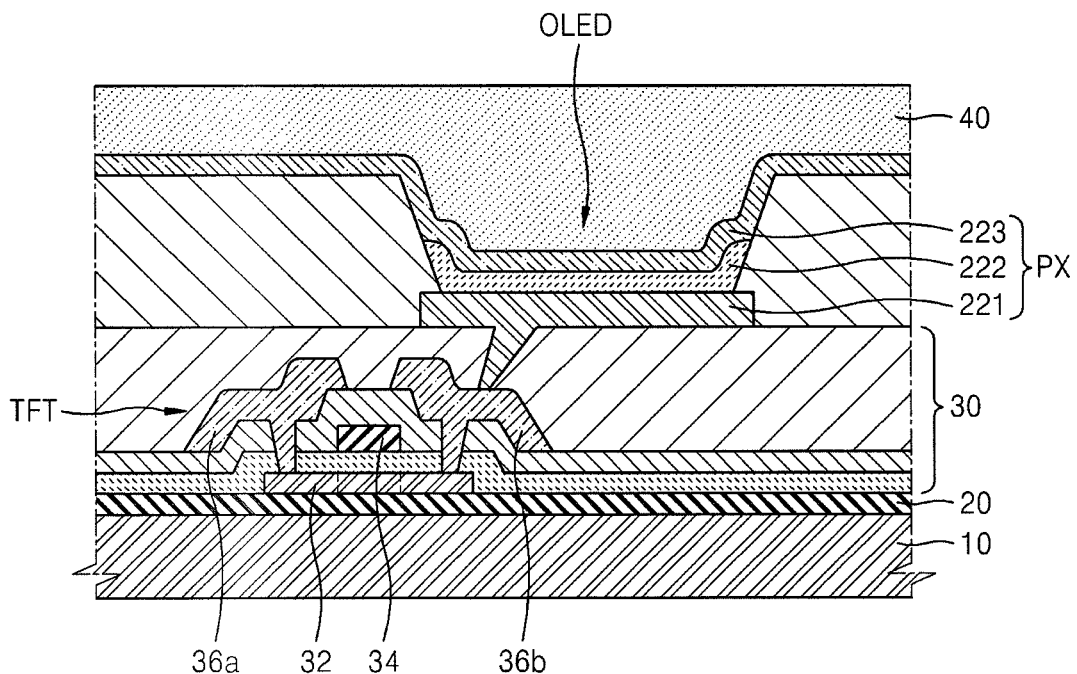
FIG. 4 is a cross-sectional view schematically illustrating one pixel unit of the flexible display device of FIG. 1.

FIG. 4 is a cross-sectional view schematically illustrating one pixel unit A of the flexible display device of FIG. 1.

Referring to FIG. 4, the buffer layer 20 and the device/wiring layer 30 may be disposed on the substrate 10, and the device/wiring layer 30 may include an operating TFT, a switching TFT (not shown), a capacitor, and wiring sets (not shown) connected to the TFT or the capacitor.

The operating TFT includes an active layer 32, a gate electrode 34, a source electrode 36a, and a drain electrode 36b.

In the present example embodiment, the pixel unit (PX) disposed on the device/wiring layer 30 includes a pixel electrode 221, an organic light emitting layer 222 disposed on the pixel electrode 221, and a counter electrode 223 formed on the organic light emitting layer 222.

In the present example embodiment, the pixel electrode 221 is an anode and the counter electrode 223 is a cathode, but the pixel electrode 221 may be a cathode and the counter electrode 223 may be an anode according to an operating method of the flexible display device 1 of FIG. 1. Holes and electrons are injected into the organic light emitting layer 222 from the pixel electrode 221 and the counter electrode 223. Excitons formed by the combination of injected holes and electrons emit light while dropping from an excited state to a ground state.

The pixel electrode 221 is electrically connected to the operating TFT formed on the device/wiring layer 30.

The present example embodiment includes a structure where a pixel unit (PX) is disposed on the device/wiring layer 30 on which the operating TFT is disposed, but the structure may be modified in various forms such as a structure where the pixel electrode 221 of the pixel unit (PX) is formed on the same layer as the active layer 32 of the TFT, a structure where the pixel electrode 221 is formed on the same layer as the gate electrode 34, or a structure where the pixel electrode 221 is formed on the same layer as the source electrode 36a and the drain electrode 36b.

Furthermore, in the operating TFT of the present example embodiment, the gate electrode 34 is disposed on the active layer 32, but the gate electrode 34 may be disposed on the lower surface of the active layer 32.

The pixel electrode 221 included in the pixel unit (PX) of the present example embodiment may be a reflective electrode, and the pixel electrode 221 may include a reflective film composed of Ag, Mg, Al, Pt, Pd, Au, Ni, Nd, Ir, Cr, etc., or a combination thereof, and may include a transparent or semi-transparent electrode layer formed on the reflective film.

The transparent or semi-transparent electrode layer may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 223 disposed to face the pixel electrode 221 may be a transparent or semi-transparent electrode, and may be formed as a thin metal film having a work function, including Li, Ca, LiF/Ca, LiF/Al, Al, Ag, Mg, etc., or a compound thereof. Furthermore, an auxiliary electrode layer or a bus electrode may be further formed of materials for forming a transparent electrode, such as ITO, IZO, ZnO, or $In_2O_3$ on the thin metal film.

Thus, the counter electrode 223 may transmit light emitted from the pixel unit (PX).

An organic light emitting layer 222 is disposed between the pixel electrode 221 and the counter electrode 223, and the organic light emitting layer 222 may be formed of organic materials having small molecular weight or organic materials having high molecular weight.

An intermediate layer such as a hole transport layer (HTL), a hole injection layer (HIL), an electron transport layer (ETL), and an electron injection layer (EIL) as well as the organic light emitting layer 222 may be selectively disposed between the pixel electrode 221 and the counter electrode 223.

The light emitted from the organic light emitting layer 222 may be reflected by the pixel electrode 221 composed of a direct or reflective electrode and may then be emitted to the counter electrode 223 side (front-emitting type).

However, the flexible display device 1 of the present example embodiment is not limited to the front-emitting type, and may be a back-emitting type in which the light emitted from the organic light emitting layer 222 may be emitted to the substrate 10 side. In this case, the pixel electrode 221 may be formed of a transparent or semi-transparent electrode, and the counter electrode 223 may be formed of a reflective electrode.

Furthermore, the flexible display device 1 may be a dual type that emits light in both front and backward directions.

The sealing layer 40 may be disposed on the counter electrode 223. The sealing layer 40 may be formed of, e.g., an inorganic film formed of a plurality of layers, a thin film including an inorganic layer and an organic layer, etc. The sealing layer 40 helps prevent external moisture and oxygen, etc., from permeating the pixel unit (PX).

Figure 5:
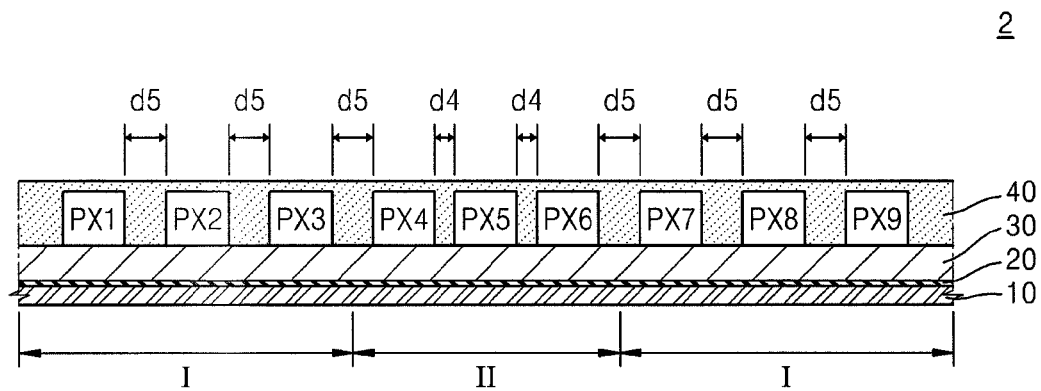
FIG. 5 is a cross-sectional view schematically illustrating a flexible display device according to an example embodiment.
Figure 6:
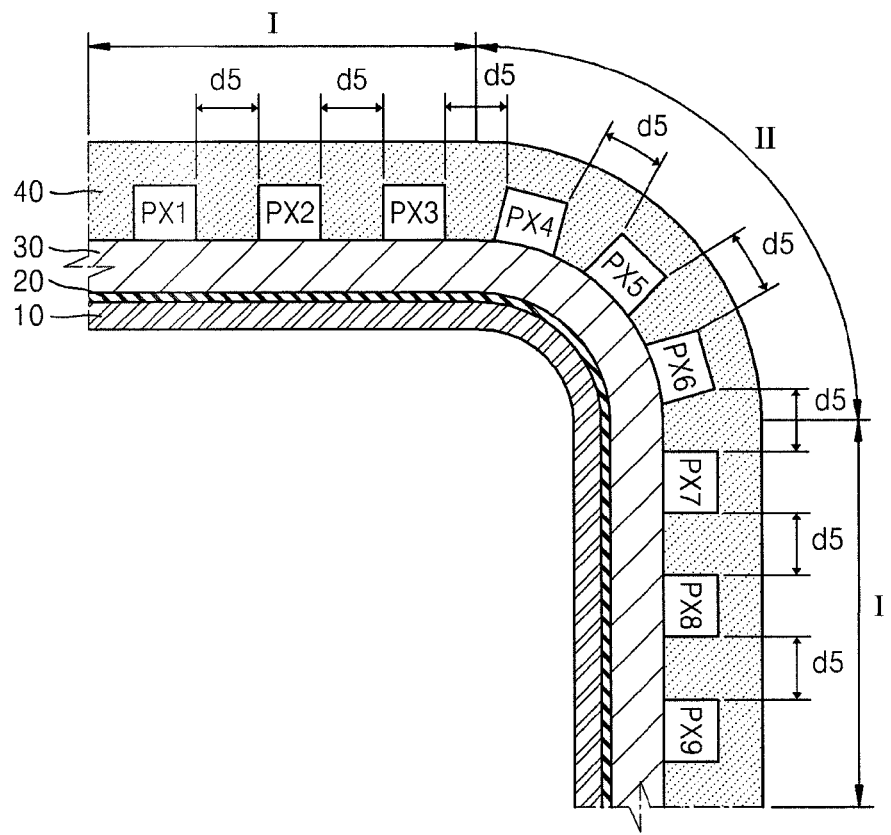
FIG. 6 is a cross-sectional view schematically illustrating a bent form of the flexible display device of FIG. 5.

FIG. 5 is a cross-sectional view schematically illustrating a flexible display device 2 according to an example embodiment, and FIG. 6 is a cross-sectional view schematically illustrating a bent form of the flexible display device 2 of FIG. 5. In FIG. 5, the same reference numbers are used for the same components as in the flexible display device 1 of FIG. 1, and a description thereof will not be repeated here.

Referring to FIG. 5, the flexible display device 2 includes a flat area I corresponding to an area where the substrate 10 is not bent and a bending area II where the substrate 10 is bent.

Inter-pixel intervals d5 of the first pixel units (PX1, PX2, PX3, PX7, PX8, PX9) formed on the flat area I are the same, and inter-pixel intervals d4 of the second pixel units (PX4, PX5, PX6) are smaller than the inter-pixel intervals d5 of the first pixel units (PX1, PX2, PX3, PX7, PX8, PX9).

The bending area II of FIG. 5 shows the inter-pixel interval d4 of the second pixel units (PX4, PX5, PX6) before the bending area II is bent by 90 degrees. The inter-pixel intervals d4 of the second pixel units (PX4, PX5, PX6) may be set so that the numbers of pixels per unit area in the flat area I and the bending area II may be the same after the bending by calculating in advance the radius of curvature when the bending area II is bent by 90 degrees.

Furthermore, the inter-pixel intervals d4 of the second pixel units (PX4, PX5, PX6) may vary depending on the degree of bending of the bending area II. For example, if the radius of the curvature increases according to the degree of bending of the bending area II, the inter-pixel intervals d4 of the second pixel units (PX4, PX5, PX6) may be adjusted to be smaller than the inter-pixel intervals d5 of the first pixel units (PX1, PX2, PX3, PX7, PX8, PX9) so that the number of pixels per unit area of the bending area II after the bending may become the same as the number of pixels per unit area of the flat area I.

FIG. 6 is a cross-sectional view illustrating a case where the bending area II of the flexible display device 2 of FIG. 5 is bent by 90 degrees.

Referring to FIG. 6, the inter-pixel intervals d5 in the bending are II are the same as the inter-pixel intervals d5 in the flat area I.

Thus, the flat area I is an area that is not bent in the flexible display device 2 and shows the same inter-pixel distance d5 before and after the bending of the bending area II, and the inter-pixel interval d4 before the bending increases to d5 after the bending. Hence, the numbers of pixels per unit area in the flat area I and the bending area II are the same, and thus the stain phenomenon of the flexible display device 2 may be prevented.

Example embodiments where the bent area II is bent by 90 degrees and 180 degrees and is fixed on the case (not shown) have been described above, but the example embodiments are not limited thereto, and the bent area II may be bent by a degree greater than 0 to about 180 degrees and be fixed on the case.

Figure 7:
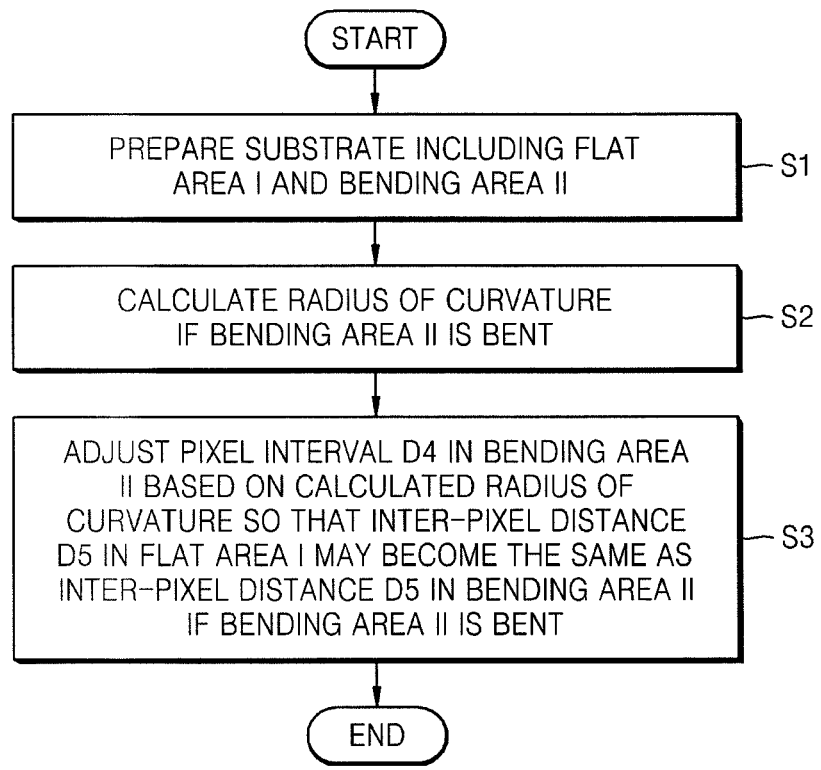
FIG. 7 is a flowchart illustrating a method of forming a flexible display device according to an example embodiment.

FIG. 7 is a flowchart illustrating a method of forming a flexible display device according to an example embodiment.

Referring to FIGS. 5 and 7, a substrate 10 may include a flat area I that is not bent and a bending area II that is fixed in a bent state (S1).

The substrate 10 may include a buffer layer 20, and a device/wiring layer 30 including a TFT (not shown) may be formed on the buffer layer 20.

A plurality of pixel units (PX1, PX2, PX3, PX4, PX5, PX6, PX7, PX8, PX9) are formed on the device/wiring layer 30.

The plurality of pixel units (PX1, PX2, PX3, PX4, PX5, PX6, PX7, PX8, PX9) include first pixel units (PX1, PX2, PX3, PX7, PX8, PX9) and second pixel units (PX4, PX5, PX6). The first pixel units (PX1, PX2, PX3, PX7, PX8, PX9) are formed on the flat area I, and the second pixel units (PX4, PX5, PX6) are formed on the bending area II.

The pixel interval of the second pixel units (PX4, PX5, PX6) formed on the bending area II is narrower than the inter-pixel interval of the first pixel units (PX1, PX2, PX3, PX7, PX8, PX9) formed on the flat area I.

Thus, the first pixel units (PX1, PX2, PX3, PX7, PX8, PX9) and the second pixel units (PX4, PX5, PX6) may be formed using a mask in which the mask pattern interval of the bending area II is smaller than the mask pattern interval of the flat area I.

The inter-pixel interval of the first pixel units (PX1, PX2, PX3, PX7, PX8, PX9) may be made physically different from the inter-pixel interval of the second pixel units (PX4, PX5, PX6) through a photo-mask process.

As the inter-pixel interval of the first pixel units (PX1, PX2, PX3, PX7, PX8, PX9) may be physically different from the inter-pixel interval of the second pixel units (PX4, PX5, PX6), the TFT of the device/wiring layer 30, which operates the pixels of the first pixel units (PX1, PX2, PX3, PX7, PX8, PX9) and the second pixel units (PX4, PX5, PX6), may also be different.

For example, if the inter-pixel interval d4 in the bending area II is narrower than the inter-pixel interval d5 in the flat area I, the interval of the TFT, which operates the pixels of the bending area II in the device/wiring layer 30, may be narrower than the interval of the TFT that operates the pixels of the flat area I.

Considering the method of determining the inter-pixel interval of the second pixel units (PX4, PX5, PX6), the radius of curvature when the bending area II is bent is calculated (S2).

Next, if the bending area II of the flexible display device 2 is bent, the inter-pixel intervals d4 in the bending area II is adjusted based on the calculated radius of curvature so that the inter-pixel distances in the flat area I and the bending area II may become the same (S3).

The adjustment in the inter-pixel interval d4 in the bending area II may be performed by adjusting the interval of the above-mentioned mask pattern.

According to a method of forming a flexible display device according to an example embodiment, pixels are not formed to have the same interval in the flexible display device, but the flat area I may be distinguished from the bending area II so that there may be different intervals in the areas I and II.

Thus, if the bending area II is bent and is mounted on the case, the same number of pixels per unit area as that in the flat area I may be implemented, and thus the stain phenomenon may be prevented and the color distortion that occurs when there is more than a certain curvature may be prevented, thereby enhancing the reliability of the flexible display device.

Implementing the same number of pixels per unit area by adjusting the inter-pixel intervals d4 has been described above, but the intervals of the operating TFT that operates the pixels according to the adjustment of the inter-pixel intervals may also be adjusted.

Furthermore, the case where the sizes of respective pixels in the plurality of pixels (PX1, PX2, PX3, PX4, PX5, PX6, PX7, PX8, PX9) are the same has been illustrated above. However, the example embodiments are not limited thereto, and the pixel size of the second pixel units (PX4, PX5, PX6) may be formed to be greater than the pixel size of the first pixel units (PX1, PX2, PX3, PX7, PX8, PX9). In this case, if the bending area II is fixed, the pixel interval of the bending area II may be adjusted to be the same as the pixel number per unit area of the flat area I to help prevent the stain phenomenon.

As described above, embodiments relate to a flexible display device configured to provide an improved stain prevention capability, and a method of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display device, comprising:
   a substrate including a bending area that is bendable and a flat area that is not bent;
   a device/wiring layer including a thin film transistor, the device/wiring layer being on the substrate;
   first pixel units on the flat area on the device/wiring layer; and
   second pixel units on the bending area on the device/wiring layer, an inter-pixel interval of the first pixel units being different from an inter-pixel interval of the second pixel units.

2. The flexible display device of claim 1, wherein the inter-pixel interval of the second pixel units is smaller than the inter-pixel unit of the first pixel unit.

3. The flexible display device of claim 1, wherein the inter-pixel interval of the second pixel units is set such that a number of pixels per unit area of the second pixel units has the same number of pixels per unit of the first pixel units of the flat area when the bending area is bent.

4. The flexible display device of claim 1, wherein compressive and tensile stress is not generated in the flat area if the flexible display device is bent in the bending area, and
   wherein tensile stress is generated on an upper surface of the bending area and compressive stress is generated on a lower surface of the bending area when the flexible display device is bent in the bending area.

5. The flexible display device of claim 1, wherein the substrate includes polyethyleneterephthalate, polyethylenenaphthalate, polycarbonate, polyarylate, polyetherimide, polyethersulfone, or polyimide.

6. The flexible display device of claim 1, wherein the bending area is fixed in a bent state.

7. The flexible display device of claim 1, wherein the first pixel units and the second pixel units include an organic light emitting layer.

8. The flexible display device of claim 1, further comprising:
   a sealing layer covering the first pixel units and the second pixel unit.

9. The flexible display device of claim 8, wherein the sealing layer includes alternating organic and inorganic films or a multi-layer inorganic film.

10. A flexible display device, comprising:
    a substrate including a flat area that is not bent and a bending area that is fixed in a bent form;
    first pixel units on the flat area; and
    second pixel units on the bending area, a number of pixels per unit area of the first pixel units being the same as a number of pixels per unit area of the second pixel units.

11. The flexible display device of claim 10, wherein the bending area is bent from greater than 0 degrees to about 180 degrees, and is fixed.

12. The flexible display device of claim 10, wherein the substrate includes polyethyleneterephthalate, polyethylenenaphthalate, polycarbonate, polyarylate, polyetherimide, polyethersulfone, or polyimide.

13. The flexible display device of claim 10, wherein the first pixel units and the second pixel units include an organic light emitting layer.

14. The flexible display device of claim 10, further comprising:
    a sealing layer covering the first pixel units and the second pixel units.

15. The flexible display device of claim 10, wherein the sealing layer includes alternating organic and inorganic films or a multi-layer inorganic film.

16. A method of manufacturing a flexible display device, the method comprising:
    preparing a substrate including a flat area that is not bent and a bending area that is fixed in a bent form, the substrate having a radius of curvature of the bending area in the bent form; and
    forming first pixel units on the flat area and second pixel units on the bending area so that a number of pixels per unit area in a state where the bending area is bent is the same as a number of pixels per unit area in the flat area based on the radius of curvature.

17. The method of claim 16, wherein an inter-pixel interval of the second pixel units is smaller than an inter-pixel interval of the first pixel units.

18. The method of claim 16, wherein the first pixel units and the second pixel units include an organic light emitting layer.

19. The method of claim 16, further comprising:
    forming a sealing layer to cover the first pixel units and the second pixel unit.

20. The method of claim 19, wherein the sealing layer is formed by alternating an organic film and an inorganic film or is formed as a multi-layer inorganic film.

\* \* \* \* \*